United States Patent
Hu et al.

(10) Patent No.: US 11,294,285 B2
(45) Date of Patent: Apr. 5, 2022

(54) METHOD FOR MANUFACTURING CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Xian-Qin Hu, Qinhuangdao (CN); Mei Yang, Qinhuangdao (CN); Jun Dai, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 118 days.

(21) Appl. No.: 16/843,123

(22) Filed: Apr. 8, 2020

(65) Prior Publication Data
US 2020/0236783 A1 Jul. 23, 2020

Related U.S. Application Data

(62) Division of application No. 15/817,052, filed on Nov. 17, 2017, now Pat. No. 10,653,011.

(30) Foreign Application Priority Data

Oct. 13, 2017 (CN) .......................... 201710954369.X

(51) Int. Cl.
*G03F 7/095* (2006.01)
*C23C 30/00* (2006.01)
(Continued)

(52) U.S. Cl.
CPC .......... *G03F 7/0957* (2013.01); *C23C 28/021* (2013.01); *C23C 28/023* (2013.01);
(Continued)

(58) Field of Classification Search
None
See application file for complete search history.

(56) References Cited

U.S. PATENT DOCUMENTS 7,288,739 B2 * 10/2007 Gregory ................. H05K 1/184
  219/121.69
9,894,765 B2 * 2/2018 Miura .................... H05K 1/115
(Continued)

FOREIGN PATENT DOCUMENTS

JP          2004-095983 A      3/2004

*Primary Examiner* — Kathleen Duda
(74) *Attorney, Agent, or Firm* — ScienBiziP, P.C.

(57) ABSTRACT

A method for manufacturing the circuit board comprises following steps of forming a silver layer on each of two opposite surfaces of an insulating substrate, and forming a copper layer on each silver layer, thereby obtaining a middle structure; defining at least one through-hole on the middle structure, and each through-hole extending through each copper layer; forming a copper wiring layer on the copper layers to cover each through-hole and a portion region of the copper layers, the copper wiring layer comprising a copper conductive structure passing through each through-hole, the copper conductive structure connecting the copper layers; removing the copper layers not covered by the copper wiring layer; and etching the silver layers to form a silver wiring layer corresponding to the copper wiring layer, wherein a first etching liquid, which does not etch the copper wiring layer, is used for etching the silver layers.

9 Claims, 8 Drawing Sheets

(51) Int. Cl.
*H05K 3/38* (2006.01)
*H05K 3/06* (2006.01)
*C23G 1/10* (2006.01)
*C23C 28/02* (2006.01)
*H05K 3/40* (2006.01)
*H05K 3/18* (2006.01)
*H05K 1/09* (2006.01)
*C23F 1/44* (2006.01)
*C23F 1/02* (2006.01)
*G03F 7/20* (2006.01)

(52) U.S. Cl.
CPC ............... *C23C 30/00* (2013.01); *C23F 1/02* (2013.01); *C23F 1/44* (2013.01); *C23G 1/103* (2013.01); *H05K 1/097* (2013.01); *H05K 3/06* (2013.01); *H05K 3/064* (2013.01); *H05K 3/188* (2013.01); *H05K 3/38* (2013.01); *H05K 3/388* (2013.01); *H05K 3/4053* (2013.01); *G03F 7/20* (2013.01); *H05K 2201/0341* (2013.01); *H05K 2203/1572* (2013.01)

(56) References Cited

U.S. PATENT DOCUMENTS 10,104,771 B1* 10/2018 Ho .................... H05K 3/108
2006/0068573 A1* 3/2006 Shintate ............ H05K 3/4664
438/584

* cited by examiner

METHOD FOR MANUFACTURING CIRCUIT BOARD

CROSS-REFERENCE TO RELATED APPLICATIONS

This is a divisional application of patent application Ser. No. 15/817,052, filed on Nov. 17, 2017, assigned to the same assignee, which is based on and claims priority to China Patent Application No. 201710954369.X filed on Oct. 13, 2017, the contents of which are incorporated by reference herein.

FIELD

The subject matter herein generally relates to a method for manufacturing the circuit board.

BACKGROUND

A circuit board usually comprises a copper wiring layer and an insulating substrate, and the copper wiring layer is directly connected to the insulating substrate. An adhesive force between the copper wiring layer and the insulating substrate is not strong enough in a conventional circuit board.

BRIEF DESCRIPTION OF THE DRAWINGS

Implementations of the present technology will now be described, by way of example only, with reference to the attached figures.

DETAILED DESCRIPTION

Figure 1:
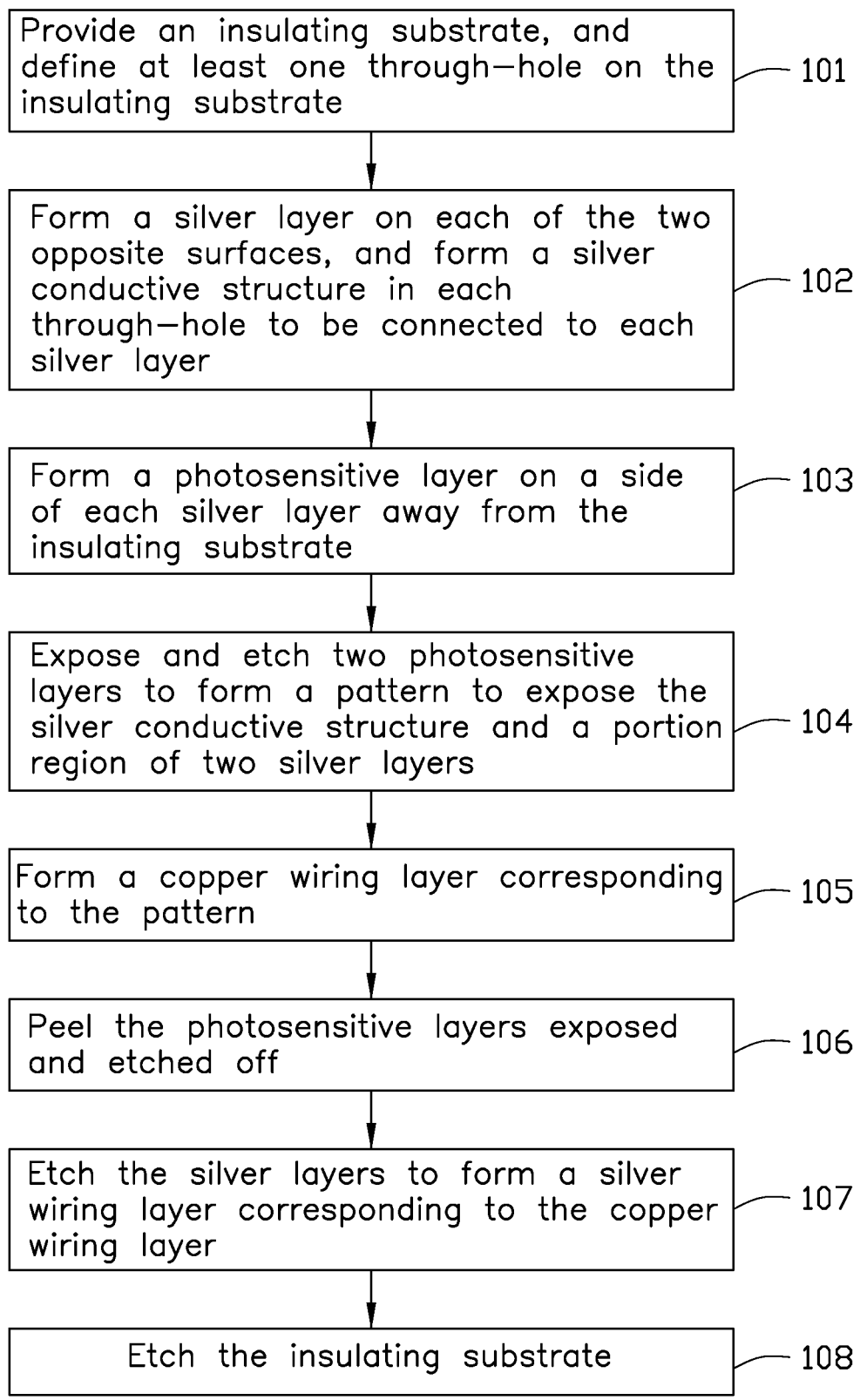
FIG. 1 is a flowchart of a first exemplary embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart in accordance with a first exemplary embodiment. The first exemplary method for manufacturing a circuit board 100 (shown in FIG. 9) is provided by way of example only, as there are a variety of ways to carry out the method. Each block shown in FIG. 1 represents one or more processes, methods, or subroutines carried out in the first exemplary method. Furthermore, the illustrated order of blocks is by example only and the order of the blocks can be changed. Additional blocks may be added or fewer blocks may be utilized, without departing from this disclosure. The first exemplary method can begin at block 101.

Figure 2:
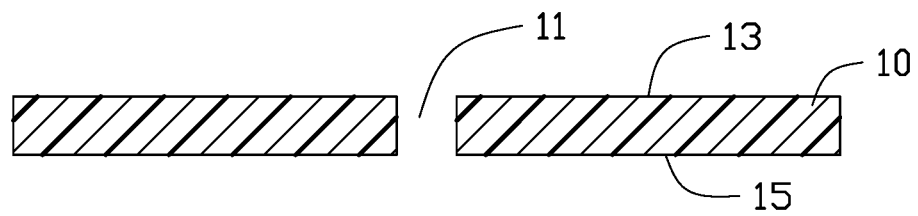
FIG. 2 is a cross-sectional view showing at least one through-hole being defined on an insulating substrate.

At block 101, referring to FIG. 2, an insulating substrate 10 is provided, and at least one through-hole 11 is defined on the insulating substrate 10.

The insulating substrate 10 comprises a first surface 13 and a second surface 15 facing away from the first surface 13. Each through-hole 11 extends through the first surface 13 and the second surface 15.

In at least one exemplary embodiment, the insulating substrate 10 can be made of polyimide, poly(ethylene terephthalate), polypropylene or polyethylene naphthalate. Each through-hole 11 can be defined by laser, mechanical cutting or punching.

Figure 3:
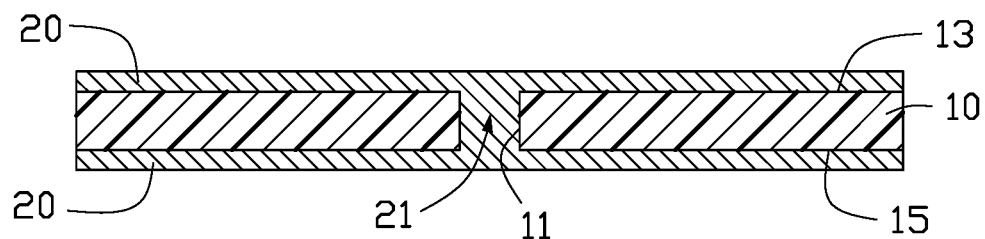
FIG. 3 is a cross-sectional view showing two silver layers being formed on two opposite surface of the insulating substrate of FIG. 2.

At block 102, referring to FIG. 3, two silver layers 20 are applied. One is formed on the first surface 13, and the other is formed on the second surface 15. A silver conductive structure 21 is formed in each through-hole 11 connecting the two silver layers 20.

In at least one exemplary embodiment, a silver paste with nano silver particles is coated on the first surface 13, the second surface 15, and the through-hole 11, and heated to cure. The silver layers 20 and the silver conductive structure 21 are thereby formed.

In at least one exemplary embodiment, a diameter of each nano silver particle is less than 100 nm, and each silver layer 20 has a thickness of about 0.15 μm to about 0.3 μm. In another exemplary embodiment, the diameter of each nano silver particle and the thickness of each silver layer 20 can vary according to specific needs.

In at least one exemplary embodiment, the silver conductive structure 21 is fully infilled in the through-hole 11 to connect the two silver layers 20. In another exemplary embodiment, the silver conductive structure 21 is not fully infilled in the through-hole 11, and is formed on an inner surface of the through-hole 11 to connect the two silver layers 20.

Figure 4:
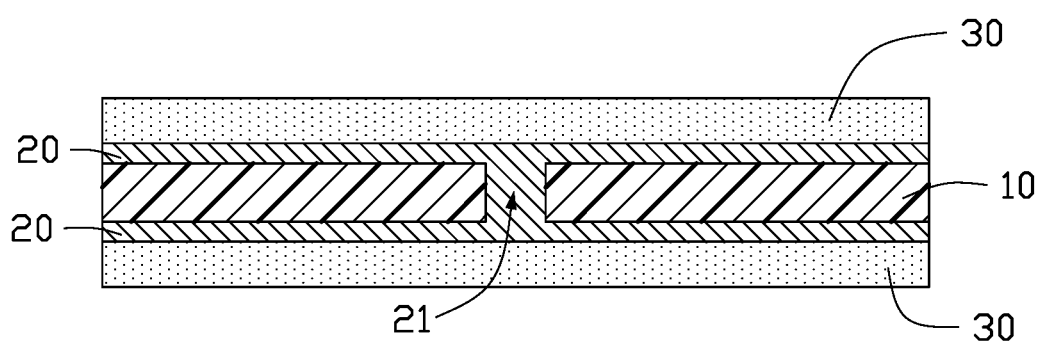
FIG. 4 is a cross-sectional view showing a photosensitive layer being formed on a side of each silver layer of FIG. 3.

At block 103, referring to FIG. 4, a photosensitive layer 30 is formed on a side of each silver layer 20 away from the insulating substrate 10 to cover the silver layer 20 and the silver conductive structure 21.

Figure 5:
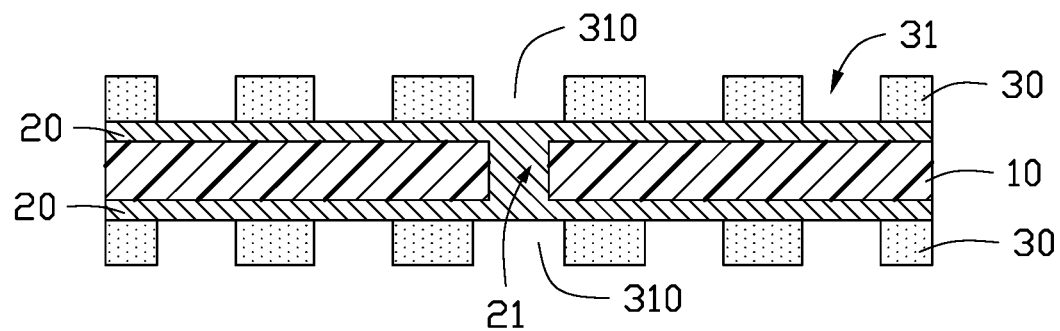
FIG. 5 is a cross-sectional view showing two photosensitive layers of FIG. 4 being exposed and etched to form a pattern.

At block 104, referring to FIG. 5, two photosensitive layers 30 are exposed and etched to form a pattern 31 on the photosensitive layers 30 to expose the silver layers 20 and the silver conductive structure 21. The pattern 31 comprises at least one opening 310 corresponding to each silver conductive structure 21.

Figure 6:
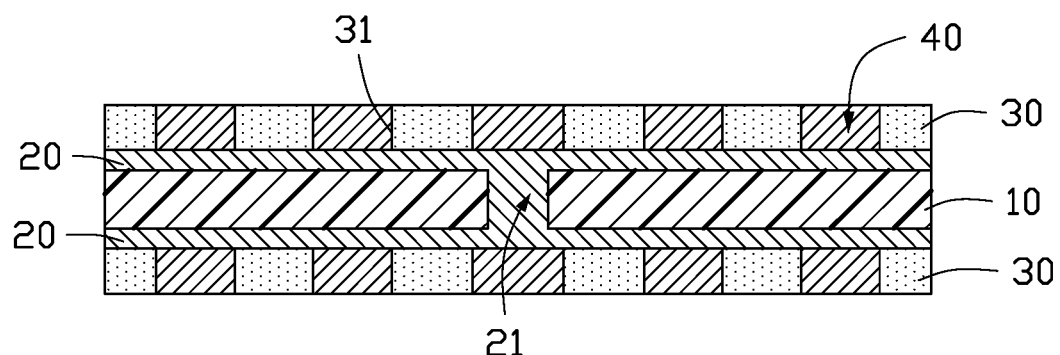
FIG. 6 is a cross-sectional view showing a copper wiring layer being formed to correspond to the pattern of FIG. 5.

At block 105, referring to FIG. 6, a copper wiring layer 40 is formed corresponding to the pattern 31. The copper wiring layer 40 covers the silver conductive structure 21.

Figure 7:
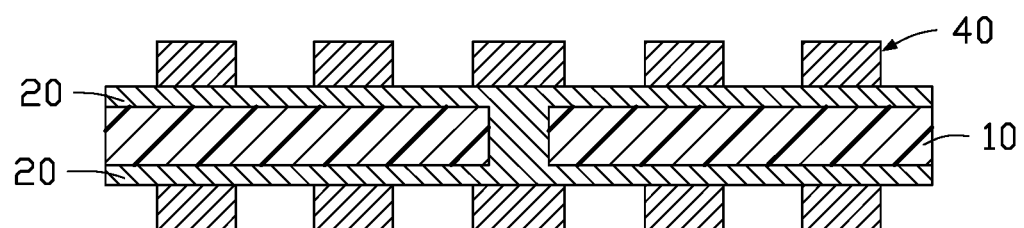
FIG. 7 is a cross-sectional view showing the photosensitive layers of FIG. 6 being peeled off.

At block 106, referring to FIG. 6 and FIG. 7, the photosensitive layers 30 exposed and etched are removed (e.g., peeled off).

Figure 8:
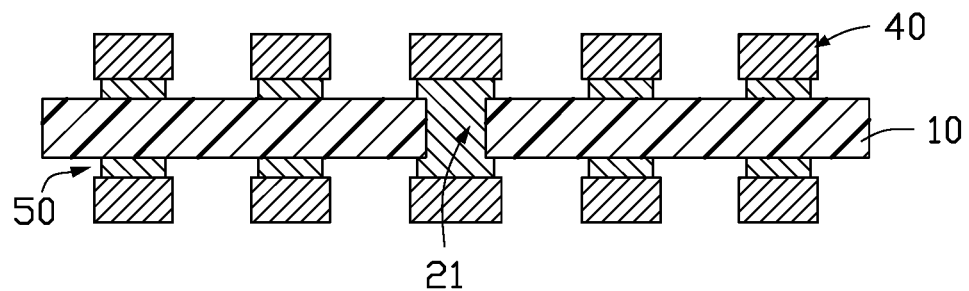
FIG. 8 is a cross-sectional view showing the silver layers of FIG. 7 being etched to form a silver wiring layer.

At block 107, referring to FIG. 7 and FIG. 8, the silver layers 20 are etched to form a silver wiring layer 50 corresponding to the copper wiring layer 40. A width of each line of the silver wiring layer 50 is less than a width of the corresponding line of the copper wiring layer 40, and a spacing between two lines of the silver wiring layer 50 is greater than a spacing between two corresponding lines of the copper wiring layer 40. A first etching liquid, which cannot etch the copper wiring layer 40, is used for etching the silver layers 20. An etching period of the first etching liquid can be extended to insure that the silver layers 20 not covered by the copper wiring layer 40 are completely removed, and the width of each line of the copper wiring layer 40 is not changed.

The silver wiring layer 50 sandwiched between the copper wiring layer 40 and the insulating substrate 10 increases a bonding force between the copper wiring layer 40 and the insulating substrate 10.

Figure 9:
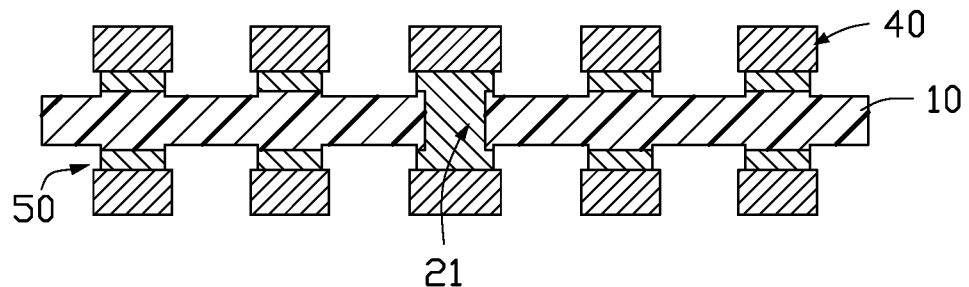
FIG. 9 is a cross-sectional view showing the insulating substrate of FIG. 8 being etched.

At block 108, referring to FIG. 7 and FIG. 9, the insulating substrate 10 not covered by the copper wiring layer 40 is etched to remove the silver layer 20 which remains after forming the silver wiring layer 50, thereby preventing the remaining silver layer 20 from ionic migration during a subsequent process. A second etching liquid, which cannot etch the copper wiring layer 40 and the silver layer 20, is used for etching the insulating substrate 10.

In another exemplary embodiment, the block 108 can be omitted.

Figure 10:
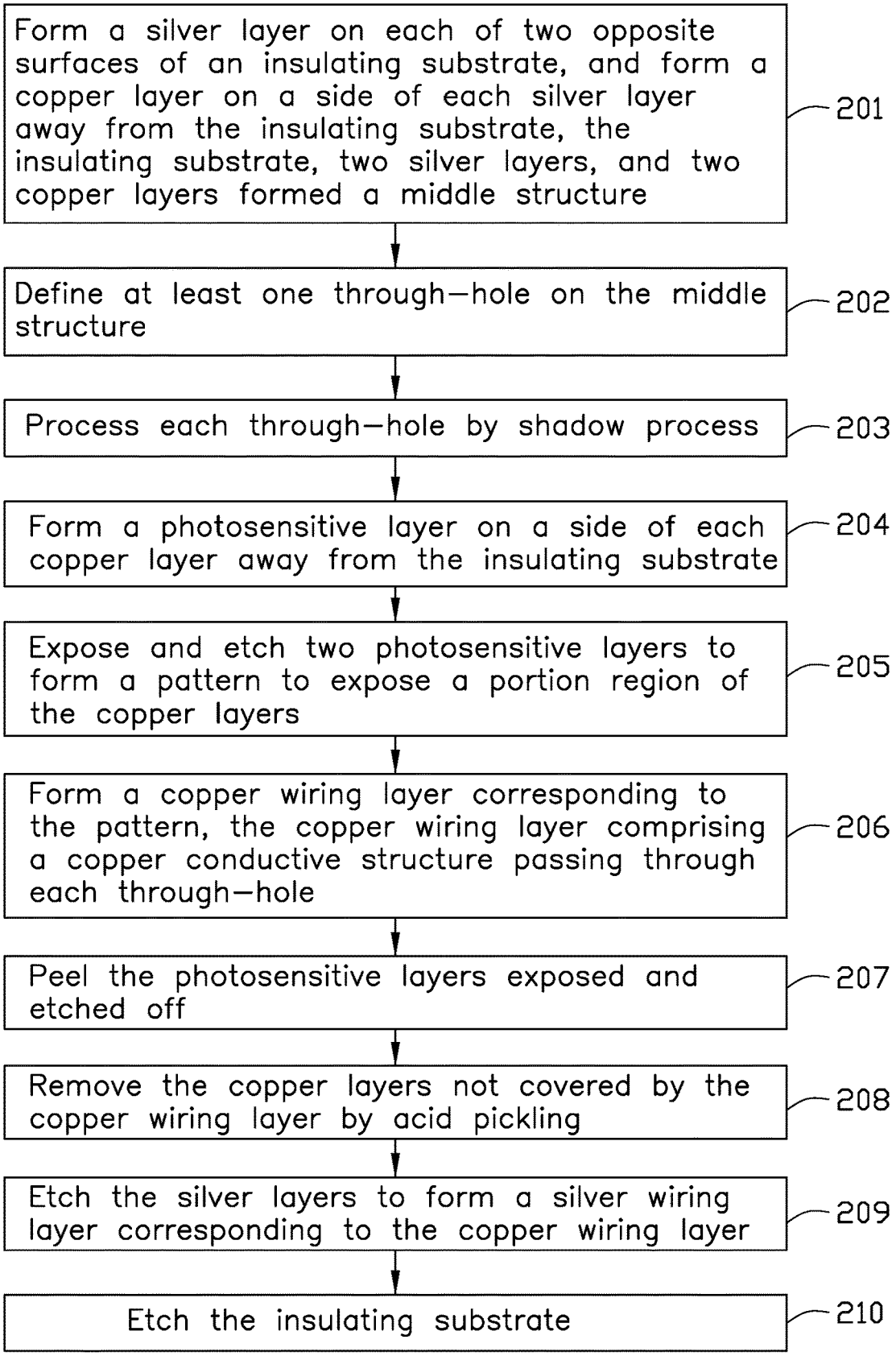
FIG. 10 is a flowchart of a second exemplary embodiment of a method for manufacturing a circuit board.

FIG. 10 illustrates a flowchart presented in accordance with a second exemplary embodiment. The second exemplary method for manufacturing a circuit board 200 (shown in FIG. 19) is provided by way of example only, as there are a variety of ways to carry out the method. Each block shown in FIG. 10 represents one or more processes, methods, or subroutines carried out in the first exemplary method. Furthermore, the illustrated order of blocks is by example only and the order of the blocks can be changed. Additional blocks may be added or fewer blocks may be utilized, without departing from this disclosure. The first exemplary method can begin at block 201.

Figure 11:
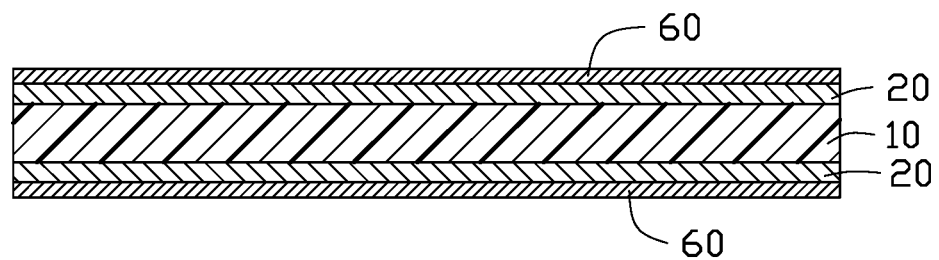
FIG. 11 is a cross-sectional view showing a middle structure being formed by an insulating substrate, two silver layers, and two copper layers.

At block 201, referring to FIG. 11, an insulating substrate 10 is provided, a silver layer 20 is formed on each of two opposite surfaces of the insulating substrate 10, and a copper layer 60 is formed on a side of each silver layer 20 away from the insulating substrate 10. The insulating substrate 10, two silver layers 20 and two copper layers 60 form a middle structure 70.

In at least one exemplary embodiment, a silver paste with nano silver particles is coated on the opposite surfaces of the insulating substrate 10, and heated to form the silver layers 20. The copper layers 60 are formed by electroplating. The copper layers 60 can prevent the silver layers 20 from being damaged during a defining of a hole on the middle structure 70 and/or a shadow process.

In at least one exemplary embodiment, a diameter of each nano silver particle is less than 100 nm, each silver layer 20 has a thickness of about 0.15 μm to about 0.3 μm, and each copper layer 60 has a thickness of about 0.5 μm to about 1 μm. In another exemplary embodiment, the diameter of each nano silver particle, the thickness of each silver layer 20, and the thickness of each copper layer 60 can vary according to specific needs.

Figure 12:
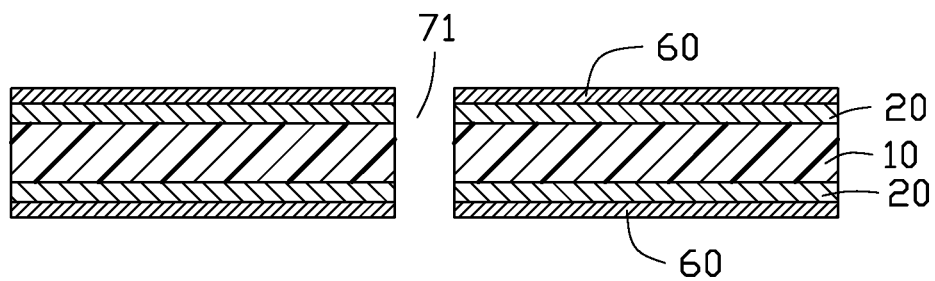
FIG. 12 is a cross-sectional view showing at least one through-hole being defined on the middle structure of FIG. 11.

At block 202, referring to FIG. 12, at least one through-hole 71 is defined on the middle structure 70. Each through-hole 71 extends through two copper layers 60.

Figure 13:
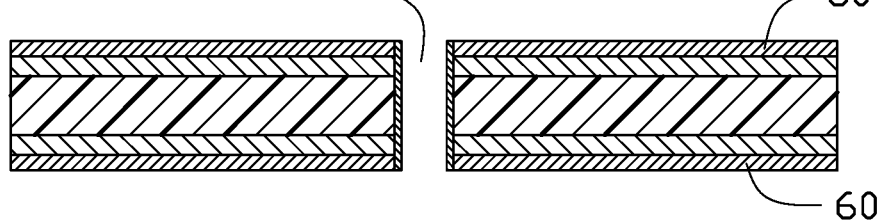
FIG. 13 is a cross-sectional view showing each through-hole of FIG. 12 being processed by shadow process.

At block 203, referring to FIG. 13, each through-hole 71 is processed by shadow process, to form a graphitic layer on an inner surface of the through-hole 71, thereby increasing a speed of electroplating during a subsequent process. In another exemplary embodiment, the block 203 can be omitted.

Figure 14:
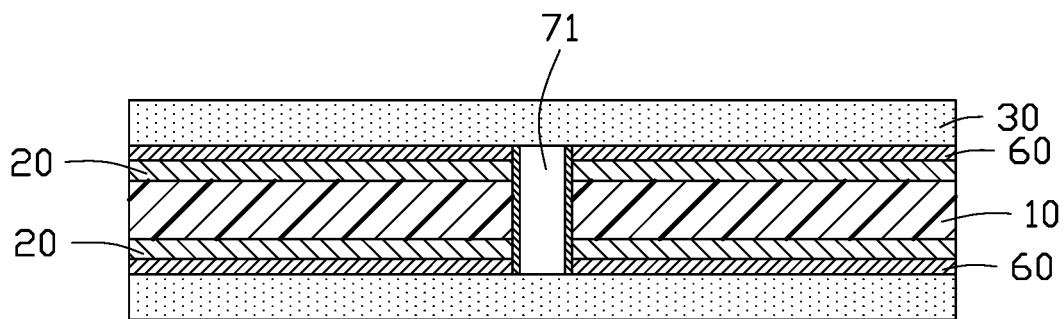
FIG. 14 is a cross-sectional view showing a photosensitive layer being formed on a side of each copper layer of FIG. 13.

At block 204, referring to FIG. 14, a photosensitive layer 30 is formed on a side of each copper layer 60 away from the insulating substrate 10 to cover the copper layer 60 and the through-hole 71.

Figure 15:
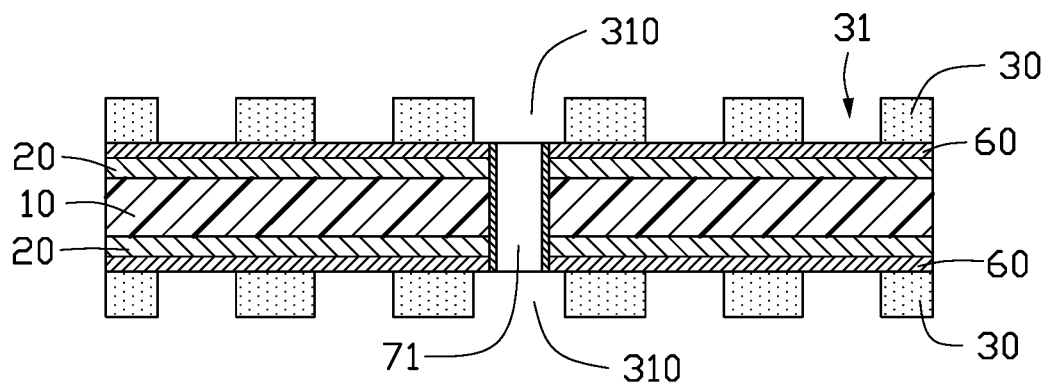
FIG. 15 is a cross-sectional view showing two photosensitive layers of FIG. 14 being exposed and etched to form a pattern.

At block 205, referring to FIG. 15, two photosensitive layers 30 are exposed and etched to form a pattern 31 on the photosensitive layers 30 to expose the copper layers 60 and the through-hole 71. The pattern 31 comprises at least one opening 310 corresponding to each through-hole 71.

Figure 16:
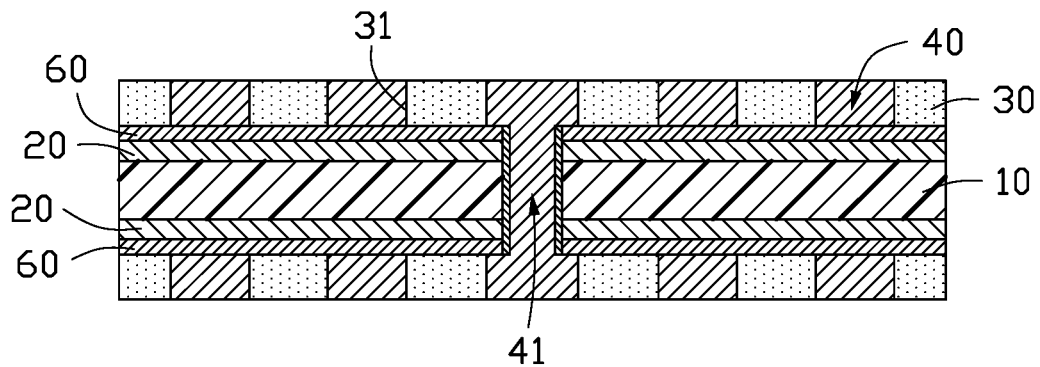
FIG. 16 is a cross-sectional view showing a copper wiring layer being formed to correspond to the pattern of FIG. 15.

At block 206, referring to FIG. 16, a copper wiring layer 40 is formed corresponding to the pattern 31. The copper wiring layer 40 comprises a copper conductive structure 41 through each through-hole to connect the copper layers 60.

Figure 17:
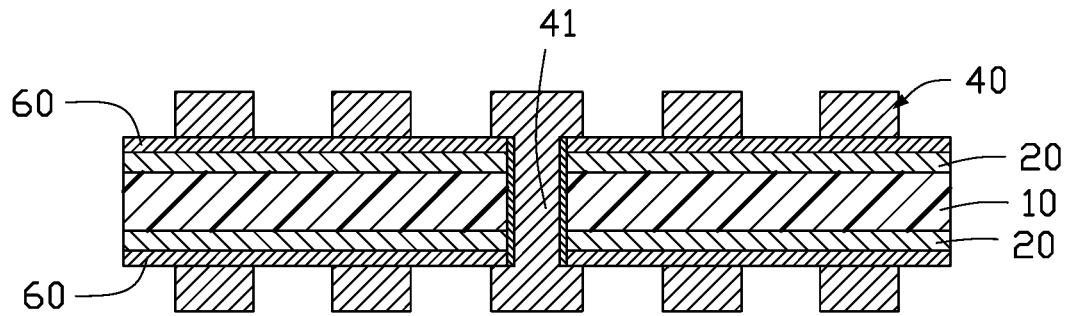
FIG. 17 is a cross-sectional view showing the photosensitive layers of FIG. 16 being peeled off.

At block 207, referring to FIG. 16 and FIG. 17, the photosensitive layers 30 exposed and etched are removed (e.g., peeled off).

Figure 18:
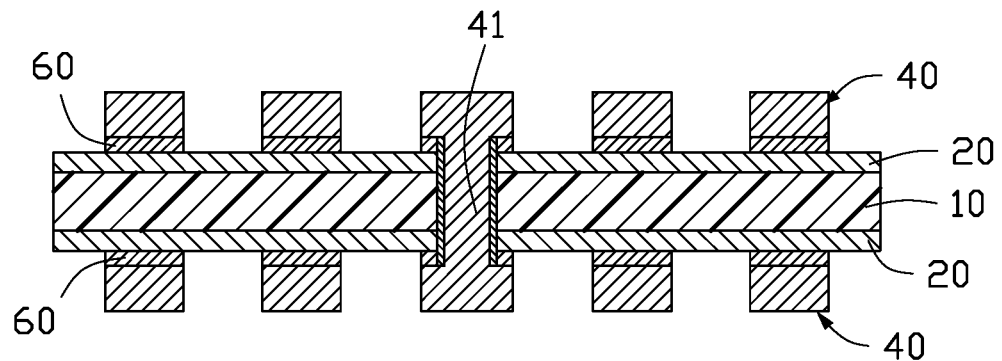
FIG. 18 is a cross-sectional view showing the copper layers of FIG. 17, which are not covered by the copper wiring layer, being removed.

At block 208, referring to FIG. 18, the copper layers 60 not covered by the copper wiring layer 40 are removed by acid pickling.

Figure 19:
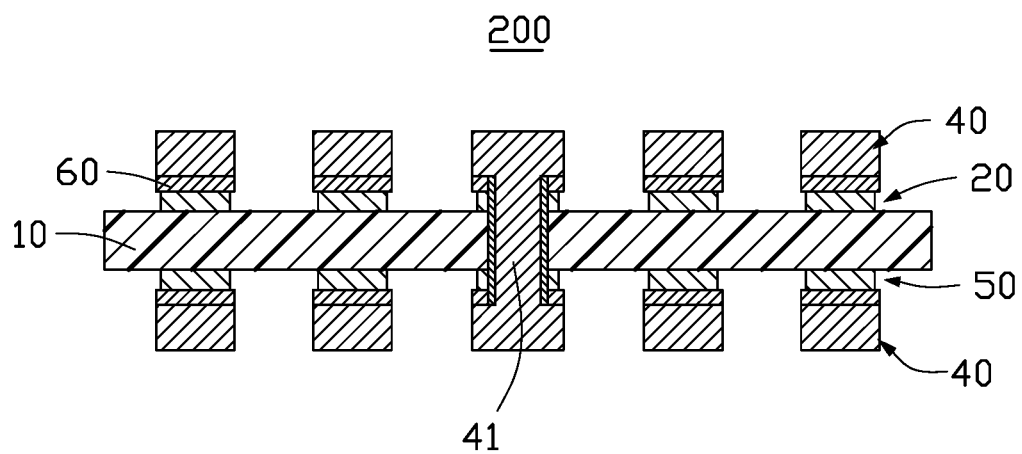
FIG. 19 is a cross-sectional view showing the silver layers of FIG. 18 being etched to form a silver wiring layer.

At block 209, referring to FIG. 19, the silver layers 20 are etched to form a silver wiring layer 50 corresponding to the copper wiring layer 40. A width of each line of the silver wiring layer 50 is less than a width of the corresponding line of the copper wiring layer 40, and a spacing between two lines of the silver wiring layer 50 is greater than a spacing between two corresponding lines of the copper wiring layer 40. A first etching liquid, which cannot etch the copper wiring layer 40, is used for etching the silver layers 20.

At block 210, the insulating substrate 10 which is not covered by the copper wiring layer 40 is etched to remove the silver layer 20 which remains after forming the silver wiring layer 50. Ionic migration during a subsequent process is prevented. A second etching liquid, which cannot etch the copper wiring layer 40 or the silver layer 20, is used for etching the insulating substrate 10.

In another exemplary embodiment, the block 210 can be omitted.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing the circuit board comprising:
   forming a silver layer on each of two opposite surfaces of an insulating substrate, and forming a copper layer on a side of each silver layer away from the insulating substrate, the insulating substrate, two silver layers, and two copper layers forming a middle structure;
   defining at least one through-hole on the middle structure, and each of the at least one through-hole extending through each copper layer;
   forming a copper wiring layer on a portion region of each copper layer, the copper wiring layer further filling in and covering each of the at least one through hole, the copper wiring layer comprising a copper conductive structure passing through each of the at least one through-hole, the copper conductive structure connecting the copper layers;
   removing the copper layers not covered by the copper wiring layer; and
   etching the silver layers to form a silver wiring layer corresponding to the copper wiring layer, wherein a first etching liquid, which does not etch the copper wiring layer, is used for etching the silver layers, a width of each line of the silver wiring layer is less than a width of a corresponding line of the copper wiring layer, and a spacing between two lines of the silver wiring layer is greater than a spacing between two corresponding lines of the copper wiring layer.

2. The method of the claim 1, wherein the silver layers are formed by the following steps:
   coating a silver paste with nano silver particles on two opposite surfaces of an insulating substrate; and
   heating to cure the silver paste with nano silver particles, thereby forming a silver layer on each of the two opposite surfaces.

3. The method of the claim 2, wherein a diameter of each nano silver particle is less than 100 nm.

4. The method of the claim 1, wherein each silver layer has a thickness of about 0.15 µm to about 0.3 µm.

5. The method of the claim 1, wherein the copper wiring layer is formed by the following steps:
   forming a photosensitive layer on a side of each copper layer away from the insulating substrate to cover the copper layer and each of the at least one through-hole;
   exposing and etching two photosensitive layers to form a pattern on the photosensitive layers to expose each of the at least one through-hole and a portion region of two copper layers, the pattern comprising an opening corresponding to each of the at least one through-hole;
   forming the copper wiring layer corresponding to the pattern; and
   peeling the photosensitive layers exposed and etched off.

6. The method of the claim 1, wherein after defining the at least one through-hole on the middle structure, and before forming the copper wiring layer on the copper layers to cover each of the at least one through-hole and the portion region of the copper layers, the method further comprising:
   processing each through-hole by shadow process.

7. The method of the claim 6, wherein a graphite layer is formed on an inner surface of each of the at least one through-hole by the shadow process.

8. The method of the claim 1, wherein after etching the silver layers to form a silver wiring layer corresponding to the copper wiring layer, the method further comprises:
   selecting a second etching liquid which does not etch the copper wiring layer and the silver wiring layer; and
   removing the silver layers remained after forming the silver wiring layer by etching the insulating substrate which is not covered by the copper wiring layer with the second etching liquid.

9. The method of the claim 1, wherein each copper layer has a thickness in a range of 0.5 µm to 1.0 µm.

* * * * *